United States Patent
Yang et al.

(10) Patent No.: US 10,559,751 B1
(45) Date of Patent: Feb. 11, 2020

(54) BOTTOM ELECTRODE FOR SEMICONDUCTOR MEMORY DEVICE

(71) Applicant: International Business Machines Corporation, Armonk, NY (US)

(72) Inventors: Chih-Chao Yang, Glenmont, NY (US); Theodorus E Standaert, Clifton Park, NY (US); Daniel C Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/139,333

(22) Filed: Sep. 24, 2018

(51) Int. Cl.
*H01L 45/00* (2006.01)
*H01L 27/24* (2006.01)

(52) U.S. Cl.
CPC ...... *H01L 45/1253* (2013.01); *H01L 27/2436* (2013.01); *H01L 45/1233* (2013.01); *H01L 45/1675* (2013.01)

(58) Field of Classification Search
CPC .................. H01L 45/1253; H01L 27/2436
USPC ............................................................ 257/4
See application file for complete search history.

(56) References Cited

U.S. PATENT DOCUMENTS

| | | | |
|---|---|---|---|
| 9,461,245 B1 | 10/2016 | Yang | |
| 9,876,169 B2 | 1/2018 | Sung | |
| 2013/0119496 A1* | 5/2013 | Zeng | H01L 43/02 257/421 |
| 2015/0035096 A1* | 2/2015 | Han | H01L 43/08 257/421 |
| 2015/0060856 A1 | 3/2015 | Tyberg | |
| 2015/0069556 A1* | 3/2015 | Yamakawa | H01L 43/02 257/421 |
| 2015/0255718 A1 | 9/2015 | Liu | |
| 2015/0311253 A1* | 10/2015 | Choi | H01L 27/228 257/252 |
| 2016/0141490 A1* | 5/2016 | Jung | H01L 43/08 257/421 |
| 2016/0218145 A1* | 7/2016 | Han | H01L 27/222 |
| 2016/0365512 A1* | 12/2016 | Sung | H01L 45/146 |
| 2017/0062031 A1* | 3/2017 | Han | H01L 27/228 |
| 2018/0040819 A1 | 2/2018 | Fraczak | |

OTHER PUBLICATIONS

IBM Patents or Patent Applications Treated As Related.

* cited by examiner

*Primary Examiner* — Igwe U Anya
(74) *Attorney, Agent, or Firm* — Jeffrey S LaBaw; Steven J Meyers; Alvin Borromeo

(57) ABSTRACT

A conductive microstud is formed in a recess of an insulator layer formed on the substrate. A bottom pedestal is formed on a top surface of the microstud. The material used for the bottom pedestal has a lower electrochemical voltage than a material used for the microstud. A top pedestal is formed on a top surface of the bottom pedestal. The top surface of at least one of the bottom pedestal and top pedestal is planarized. A conductive layer is formed on a top surface of the top pedestal. Next, a conical structure is formed. The conical structure is comprised of at least the conductive layer and a top portion of the top pedestal.

16 Claims, 12 Drawing Sheets

BOTTOM ELECTRODE FOR SEMICONDUCTOR MEMORY DEVICE

BACKGROUND OF THE INVENTION

This disclosure relates to integrated circuit devices, and more specifically, to a method and structure to improve the properties of bottom electrode structures in semiconductor devices.

In semiconductor circuits, the devices fabricated in or on a semiconductor substrate are connected with a metallic interconnection structure made of metal lines and "vias" which interconnect the metal lines. The metal lines are arranged in horizontal layers, i.e. parallel to the substrate, and separated by layers of dielectrics while vias are disposed vertically in openings in the dielectric to interconnect the layers of metal lines.

Magnetoresistive random-access memory (MRAM) is a non-volatile random-access memory technology. Although the technology has been in development since the mid-1980s, the improvements in existing memory technologies, e.g., in flash RAM and DRAM, have kept MRAM in a niche role. Nonetheless, the technology has great promise such that many believe that MRAM will eventually become the dominant type of memory in the market. Data in MRAM is not stored as electric charge or current flows, but by magnetic storage elements. The elements are formed from ferromagnetic plates typically comprised of a magnetic tunnel junction (MTJ) material. Each of the plates hold a magnetization, separated by a thin insulating layer. In some MRAMs, one of the two plates is a permanent magnet set to a particular polarity, while the other plate magnetization is variable, so that it can be changed to match that of an external electromagnetic field to store memory.

As the dimensions of the interconnection structure for an MRAM device have become smaller, challenges have been experienced to provide an adequate contact structure. One of the problems is that there is a chemical reaction between the pedestal and microstud elements of the contact structure resulting in galvanic related corrosion. Another of the problems experienced is that the fill quality of the current process is inadequate, leading to device reliability problems. Another issue is that redeposition of the already deposited layers causes reliability problems in the device structure, and therefore, the integrated circuit in which it is incorporated.

Thus, producing an improved interconnection structure is desirable. The present disclosure presents a method and structure to address the above described problems.

BRIEF SUMMARY

According to this disclosure, a structure and a method for fabricating an integrated circuit device. A conductive microstud is formed in a recess of an insulator layer formed on the substrate. A bottom pedestal is formed on a top surface of the microstud. The material used for the bottom pedestal has a lower electrochemical voltage than a material used for the microstud. A top pedestal is formed on a top surface of the bottom pedestal. The top surface of at least one of the bottom pedestal and top pedestal is planarized. A conductive layer is formed on a top surface of the top pedestal. Next, a conical structure is formed. The conical structure is comprised of at least the conductive layer and a top portion of the top pedestal.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
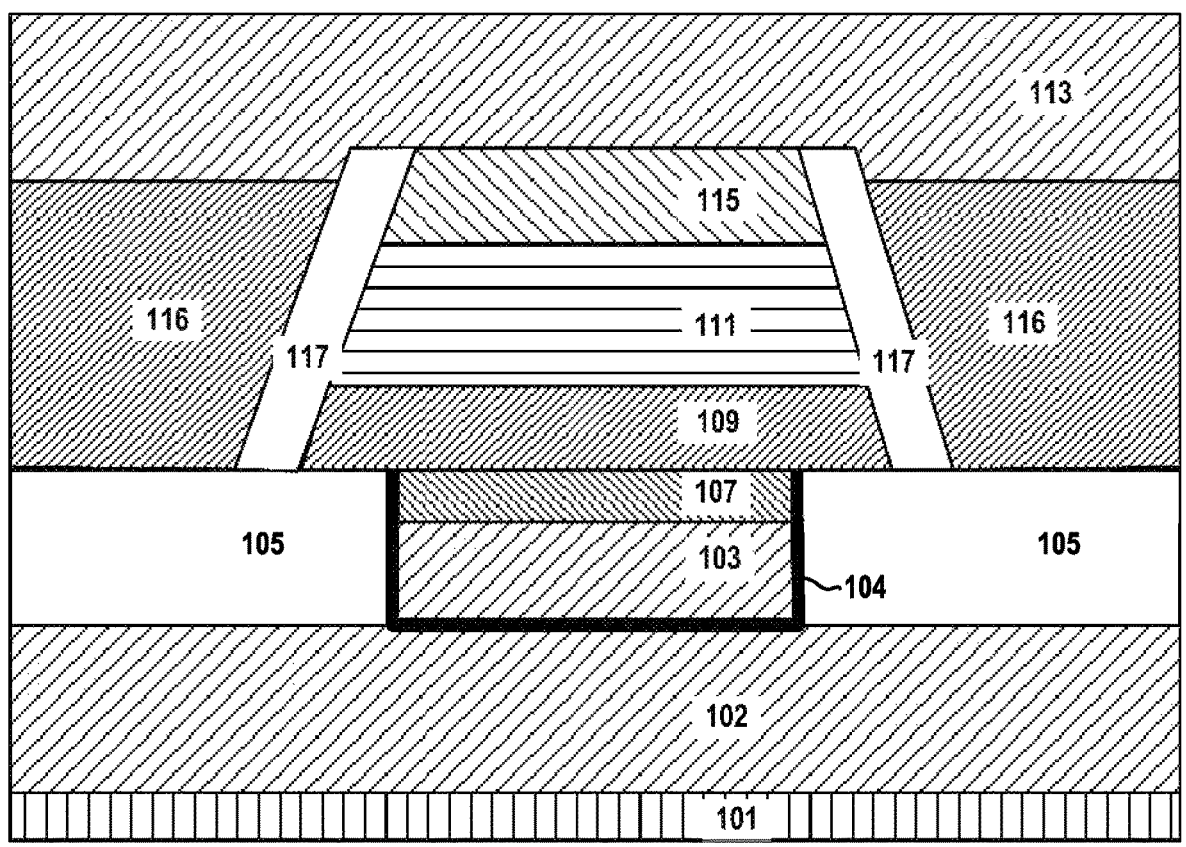
FIG. 1 is a cross-sectional diagram depicting a contact structure for a Magnetoresistive random-access memory (MRAM) device.

At a high level, embodiments of the invention provide a bilayer pedestal on top of a metal microstud in a Magnetoresistive random-access memory (MRAM) device. The material for the bottom pedestal of the bilayer pedestal is selected to have good gap fill quality and no chemical reaction with the underlying microstud. The microstud is typically copper in embodiments of the invention. The material for the top pedestal of the bilayer pedestal is selected to have a fast deposition rate and a high oxidation rate (activation energy of forming oxide less than 80 kcal/mol) during or post an Ion-beam etch (IBE) process which is used to shape the magnetic tunnel junction (MTJ) material layer used in the MRAM device. Compatibility with the MTJ layer is also needed. By providing a bilayer pedestal rather than a single layer, two materials, potentially with different deposition processes and with the best properties for compatibility with different layers of the device are selected.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. As discussed in the specification, the dielectrics are considered high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). Dielectrics with low dielectric constants, e.g., SiO2, have relative dielectric constants of 3.8 or below. Representative low-k dielectrics have dielectric constants equal or lower than 3.5. Examples of low-k dielectrics include porous SiO2, and carbon doped SiO2. The dielectric can be a combination of two or more of these materials. The thickness of dielectrics herein may vary contingent upon the required device performance.

The conductors mentioned herein can be formed of any conductive material, such as polycrystalline silicon (poly-silicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

"Electrically conductive" and/or "electrical conductor" as used through the present disclosure means a material typically having a room temperature resistivity less than about 400 μΩ-cm. As used herein, the terms "insulator" and "dielectric" denote a material having a room temperature resistivity greater than about 400μΩ-cm.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

FIG. 1 is a cross-sectional diagram depicting a contact structure for a Magnetoresistive random-access memory (MRAM) device. The device is deposited on a substrate 101 which in preferred embodiments includes a dielectric such silicon dioxide (SiO2). The bottom interconnect 102 is fabricated from a conductive material, for example, a metal such as W, Cu, Al, or alloys thereof. The bottom interconnect 102 is shown in cross section and is typically a conductive line used to interconnect the MRAM devices or other devices in the integrated circuit. Although only a single structure is shown for ease in illustration, the device structure is usually more complicated and includes a plurality of metal lines and MRAM devices.

A bottom conductor or microstud layer 103 is formed in an insulator layer 105. The microstud 103 is a conductive material such as W, Cu, Al, or alloys thereof. Some of the appropriate insulator materials for layer 105 include SiO2, SiN, SiC, and low-k dielectric materials. A liner layer 104 is shown in black in the figure. It provides a diffusion barrier and adhesion liner functions and can be made of materials such as Ta(N), W(N), Ti(N), Ru or Co.

A bilayer pedestal is built on top of the metal microstud 103 and is comprised of a bottom pedestal 107 and a top pedestal 109. The material selected for the bottom pedestal 107 should have good gap-fill quality and have no chemical reactions with the material selected for the microstud 103. For example, if copper is selected for the microstud 103, the bottom pedestal material should have less electrochemical voltage than copper so that during a subsequent process such as a wet clean or chemical mechanical polishing process no reactions take place. In addition to having a lower electrochemical voltage, the bottom pedestal 107 should have a good atomic level of lattice match to the material which makes up the microstud 103. Although specific materials will be discussed below for different embodiments, in preferred embodiments, the bottom pedestal 107 is a pure metal, metal nitride, or an alloy. The material for the top pedestal 109 is selected to have a fast deposition rate and less surface morphology or roughness than the bottom pedestal 107 since the MTJ layer 111 will be deposited on top pedestal 109. Further, the material used for the top pedestal layer 109 should have a relatively high oxidation rate during or post the IBE process used to form the MRAM cell. A "high oxidation rate" is defined as a material with an activation energy of forming oxide less than 80 kcal/mol. A relatively low redeposition rate during the IBE process is also desirable. As the top pedestal 109 is in contact with the memory stack 111, it should have a good atomic level of lattice match to the memory stack material. In embodiments of the invention, a metal nitride or metal alloy is used for the top pedestal layer 109. In one embodiment of the invention, the top pedestal layer 109 is TiN, the bottom pedestal layer 107 in TaN and the microstud 103 material is Cu.

The three layers of the microstud 103, the bottom pedestal 107 and the top pedestal 109 will be referred to as the "bottom electrode" in places in the description of the invention.

Data in an MRAM device is stored as a magnetic polarization or magnetization in magnetic storage elements formed in the magnetic tunnel junction (MTJ) layer 111. Although depicted as a single layer 111, the elements are formed from two ferromagnetic plates, each of which can hold a magnetic polarization, separated by a thin insulating layer. In embodiments of the invention, one of the two plates is a permanent magnet set to a particular magnetic polarity, the reference plate; the other plate's magnetization can be changed to match that of an external field to store memory, the free plate. This arrangement is known as a magnetic tunnel junction. Each MRAM cell device stores an MRAM bit. A complete MRAM memory device is built from a grid of such "cells".

A hard mask layer 115 is deposited on top of the MTJ layer 111. A good material for the hard mask layer 115 is TaN. It protects the MRAM cell during the IBE process and also serves to connect the device with the top interconnect 113. The inter-layer dielectric (ILD) 116 and insulator 117 isolate the MRAM cell from the conductor layers 103, 113. Like the other conductor layers, the top interconnect 113 is a metal such as Cu, Al or W. The top interconnect 113 is a connective wire which connects the MRAM cell to other MRAM cells or other devices in the device. The ILD layer 116 is SiO2 or a low-k dielectric in embodiments of the invention. The encapsulation layer 117 is preferably an insulator such as SiN or SiC. The function of the encapsulation layer is to prevent oxygen or moisture diffusion from the ILD layer 116 to the MTJ layer 111.

The structure of the layers 103, 107, 109 (e.g., using Cu/TaN/TiN in the respective layers) making up the bottom electrode underneath a memory stack 111 is novel. In the structure, one of the pedestal layers 107 (TaN) is embedded in a Cu via, and the other pedestal layer 109 (TiN) is a pedestal-like metal at bottom of the MTJ layer. In the structure, the TiN 109 and MTJ 111 sidewalls are capped with an encapsulation layer 117, e.g., SiN. The lower layer 107 TaN is not encapsulated. Also in embodiments of the invention, one or both the pedestal layers are planarized over the entire portion incorporated in the pedestal.

Although the description is directed to an MRAM device, the bottom electrodes of the embodiments of the invention can be used in other memory devices.

Figure 2:
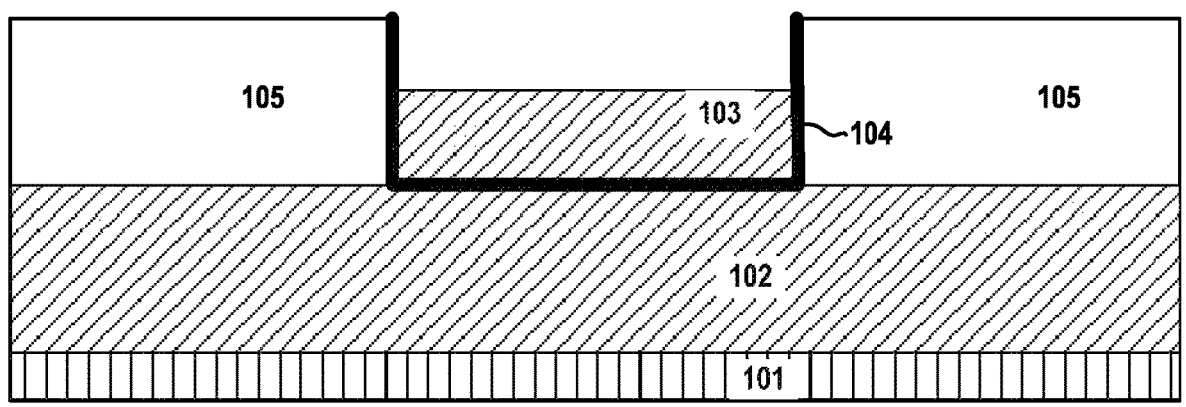
FIG. 2 is a cross-sectional diagram depicting an intermediate structure including a bottom conductor contact over a bottom interconnect according to a first embodiment of the invention.

FIG. 2 is a cross-sectional diagram depicting an intermediate structure including a bottom conductor contact over a bottom interconnect according to a first embodiment of the invention. The device is deposited on a substrate 101 such as a semiconductor wafer, or a substrate in which a number of dielectric layers and semiconductor material layers can be arranged to provide microelectronic devices, or smaller devices, which can include semiconductor devices, such as field effect transistors (FETs), fin type field effect transistors (FinFETs), bipolar junction transistors (BJT) and combinations thereof. The bottom interconnect 102 is fabricated from a conductive material, for example, a metal such as W, Cu, Al, or alloys thereof. Conventional deposition processes such as an atomic layer deposition (ALD), chemical vapor deposition (CVD), plasma enhanced chemical vapor deposition (PECVD), electroless plating to deposit the metal of the interconnect 102. The bottom interconnect 102 is shown in cross section and is typically a conductive line used to interconnect the MRAM devices or other devices in the integrated circuit. Normally, the bottom interconnect layers 102 in embodiments of the invention have respective thicknesses from 10 nm to 800 nm with thicknesses from 30 nm to 500 nm being more preferred.

A microstud layer 103 is formed in an insulator layer 105 by patterning the insulator, e.g., a photoresist or hard mask layer is first patterned over the insulator layer. A subsequent etch, e.g., a reactive ion etch (RIE) process, creates a recess for the metal which will form the microstud 103. A barrier layer 104 such as Ta(N) is used to prevent diffusion of the microstud 103 into the insulator 105. Typically, the microstud layer 103 and insulator layer 105 have respective thicknesses from 4 nm to 300 nm in different embodiments with thicknesses from 5 nm to 280 nm being more preferred. Note that the microstud layer 103 is recessed with respect to the top plane of the insulator layer. A number of processes can be used to form the recess. In one embodiment, a planarization process follows a metal fill of the recess. The planarization can be a controlled chemical mechanical polishing (CMP) process which through a selected load-down force and polishing slurry, a dish-like feature is created on the metal surface of the recess. This is sometimes called "CMP dishing". The CMP dishing process can be followed by an anneal or an etch to get the stepped profile shown in the figures.

In some embodiments, the insulator layer is a single dielectric material. In other embodiments, it may be composed of at least two different dielectric materials. The microstud metal layer 103 and barrier layer 104 can be deposited in one or more of a variety of processes known to the art, or invented in the future. The deposition processes include, for example, chemical vapor deposition (CVD), plasma enhanced chemical vapor deposition (PECVD), physical vapor deposition (PVD) or sputtering. Typical microstud metals include Cu, Al, Co, W, Ru, Ni, and alloys of the same. However, other metals can be used. Typical barrier layers include TaN, Ta, Ti, TiN, W, Ru, Ir, although other barrier layers are known to the art and are used in alternative embodiments of the invention.

Figure 3:
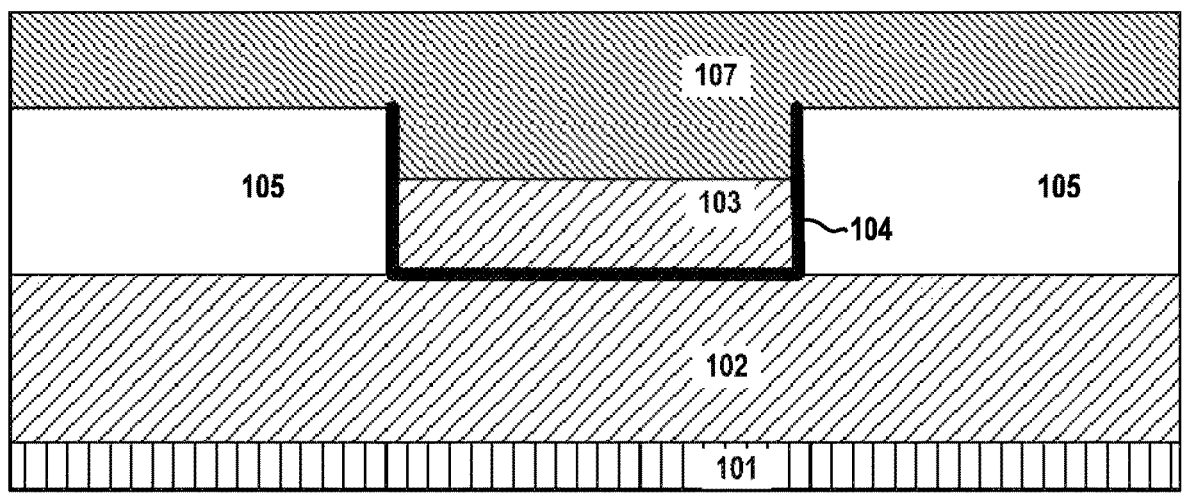
FIG. 3 is a cross-sectional diagram depicting the structure according to a first embodiment of the invention after a bottom layer of the bilayer pedestal is deposited.

FIG. 3 is a cross-sectional diagram depicting the structure according to a first embodiment of the invention after the material 107 which will form the bottom pedestal of the bilayer pedestal is deposited. The bottom pedestal 107 material should have a good atomic level of lattice match to the microstud 103 material. Although specific materials will be discussed below for different embodiments the bottom pedestal 107 is a pure metal, a metal nitride, or an alloy of the two. Metals or nitrides selected from the group of Ta, W, Ti, Al, Ru, Rh, Ir, Co, Pt, Nb, Cr, Mo and Ni are used in embodiments of the invention. The deposition processes for the bottom pedestal material include, for example, PVD, ionized physical vapor deposition (iPVD), atomic layer deposition (ALD), and CVD deposition processes in respective embodiments. Typically, as deposited, the bottom pedestal layer 107 has a thickness from 2 nm to 500 nm with a thickness from 5 nm to 300 nm being more preferred.

Figure 4:
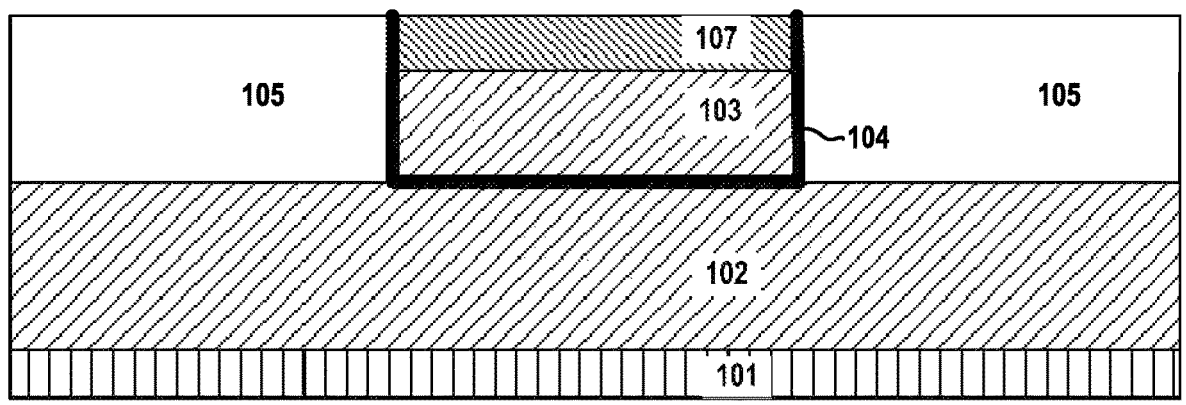
FIG. 4 is a cross-sectional diagram depicting the structure according to a first embodiment of the invention after a planarization process is performed on the bottom layer of the bilayer pedestal.

FIG. 4 is a cross-sectional diagram depicting the structure according to a first embodiment of the invention after a planarization process is performed to form the bottom pedestal of the bilayer pedestal. A chemical mechanical polishing (CMP) step is a widely used planarization process which is used in embodiments of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. Other planarization processes are known to the art and are used in alternative embodiments of the invention.

As shown in the drawing, the top surfaces of the bottom pedestal 107 and the field areas of the insulator 105 are coplanar after the planarization step. The field areas of the dielectric layer are those areas outside the etched features of the pattern in the dielectric. After the planarization step, the bottom pedestal layer 107 has a thickness from 1 nm to 300 nm with a thickness from 2 nm to 200 nm being more preferred.

Figure 5:
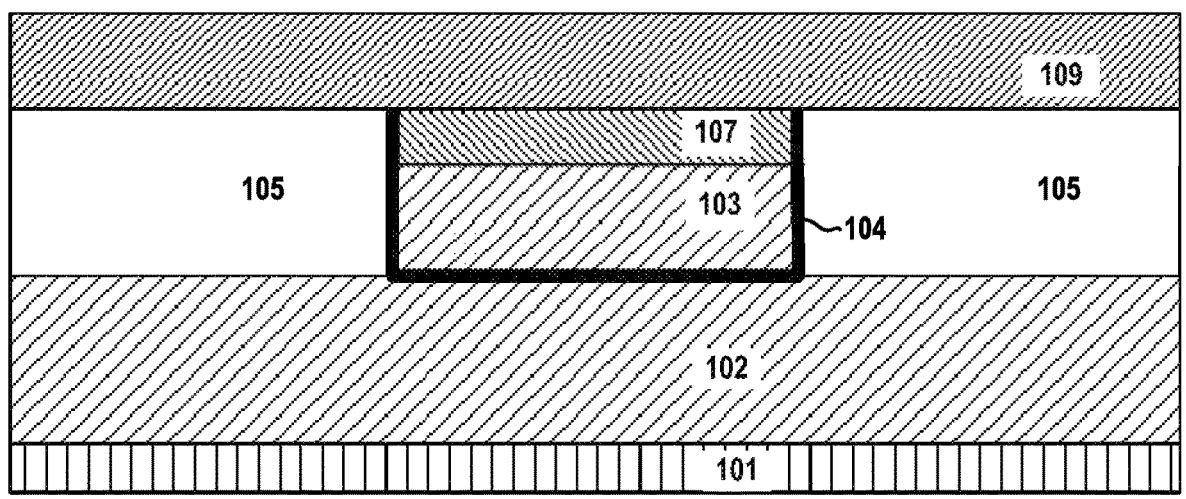
FIG. 5 is a cross-sectional diagram depicting the structure according to a first embodiment of the invention after a top layer of the bilayer pedestal is deposited.

FIG. 5 is a cross-sectional diagram depicting the structure according to a first embodiment of the invention after a layer which will form the top pedestal 109 of the bilayer pedestal is deposited. A metal nitride or an alloy layer 109 is deposited. In preferred embodiments of the invention, the top pedestal layer 109 is comprised of a metal nitride or alloy of the group of metals consisting of Ta, W, Ti, Al, Ru, Rh, Ir, Co, Pt, Nb, Cr, Mo and Ni. An optional CMP (or other planarization) process is performed after the deposition.

The deposition processes for the top pedestal material include any method used to deposit the selected group of materials presently known or developed in the future. However, PVD or iPVD deposition processes are preferred based on experimental data. The inventors found that the results from these particular deposition processes produced unexpectedly good results as compared with other deposition results conventionally used for depositing these materials. The results are improved because of both higher material purity and faster process for PVD and iPVD than chemical type of deposition methods, e.g., CVD, ALD. The formation of the top pedestal material 109 includes a thicker material layer than needed in the device in the embodiments where the deposition is followed by a planarization process. Typically, as finally formed, the top pedestal layer 109 has a thickness from 1 nm to 300 nm with a thickness from 2 nm to 200 nm being more preferred. The planarization process provides a smooth top surface for subsequent layers, e.g., a MTJ layer.

Figure 6:
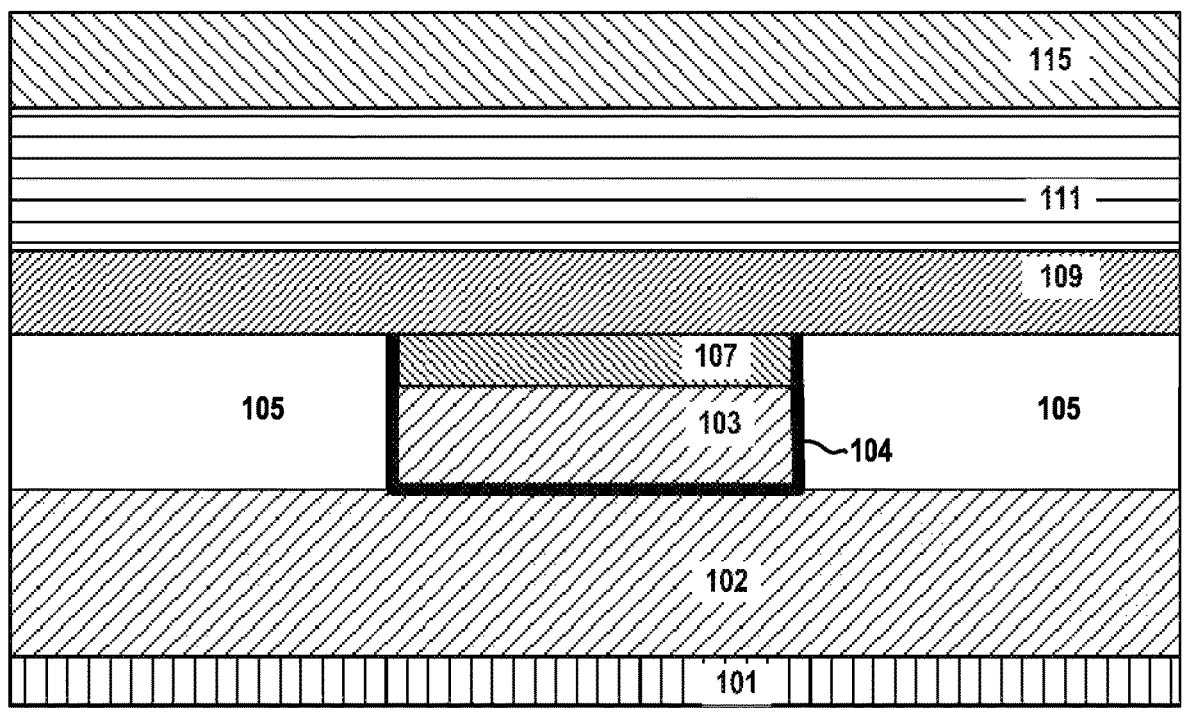
FIG. 6 is a cross-sectional diagram depicting the structure according to a first embodiment of the invention after a magnetic tunnel junction (MTJ) material layer and metal hard mask (HM) layer are deposited.

FIG. 6 is a cross-sectional diagram depicting the structure according to a first embodiment of the invention after deposition of a layer 111 onto top pedestal layer 109 in accordance with one or more embodiments. Hard mask layer 115 is deposited on top of layer 111. In the description above, the layer 111 is described as an MTJ layer. However, layer 111 can be formed of a single metal layer of metals such as copper, tungsten, aluminum, or alloys thereof or multiple layers thereof so as to define an interconnecting via between different metal line layers. In other words, layers 103, 105, 107 and 111 define a metal stack. i.e., alternating conductive metals. In the MTJ embodiments, magnetic and insulator layers form a memory stack, e.g., a magnetic tunnel junction (MTJ) structure with alternating magnetic layers and insulator layers. MTJ structures are known in the art. If layer 111 is a MTJ layer 111, a laminate structure, e.g., comprised of two ferromagnetic plates separated by a non-magnetic material, such as a nonmagnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer. A known MTJ structure uses cobalt (Co), iron (Fe), boron (B), nickel (Ni), iridium (Ir), platinum (Pt), palladium (Pd), or any combination thereof as the reference layer. MgO (among other materials) is used as the tunnel barrier layer and CoFeB as the free layer. However, other MTJ layers 111 are known to the art and could be used in embodiments of the invention.

Figure 7:
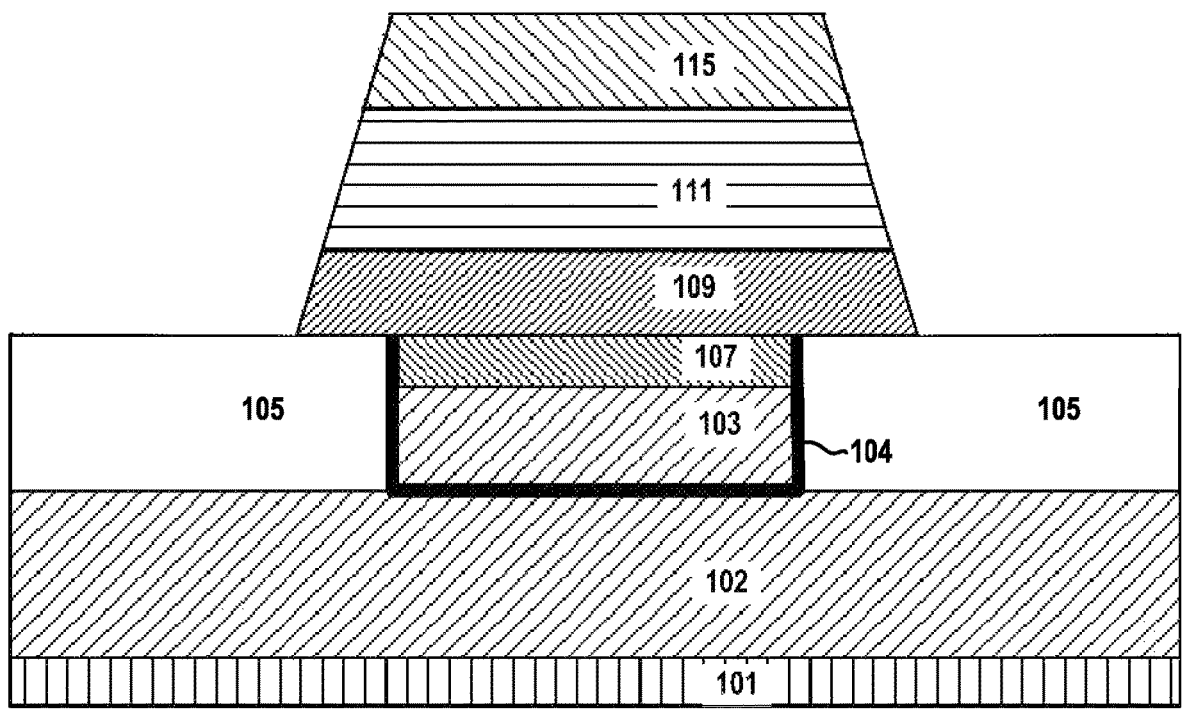
FIG. 7 is a cross-sectional diagram depicting the structure according to a first embodiment of the invention after an Ion-beam etch (IBE) process is performed.

FIG. 7 is a cross-sectional diagram depicting the structure according to a first embodiment of the invention after an Ion-beam etch (IBE) process is performed. Other modified physical ion bombardment methods (eg. Ar+, He+) may be also used in other embodiments. An IBE process is performed by focusing relatively large ions, e.g., Ga+, Xe+, to physically sputter away the material on the surface of the targeted substrate. As shown, the IBE process cuts through the hardmask layer 115, the MTJ layer 111 and the top pedestal layer 109 of the pedestal. The process leaves an MRAM cell with an angular cross-section, e.g., a conical shape in three dimensions. As the IBE process can redeposit material on the substrate, the top pedestal 109 is selected to have relatively high oxidation rates to avoid redepositing the top pedestal layer material onto the patterned sidewall of the MTJ layer 111. While the MTJ layer 111 and hard mask layer 115 could redeposit, the problem is primarily one of a lower layer depositing on an already cut, formed layer. In the structure as shown, there is no layer above the hard mask layer 115 and material from MTJ layer 111 on the sidewall of hard mask layer 115 does not affect the functioning of the device.

In some embodiments of the invention, the top pedestal 109 of the pedestal will have a larger horizontal dimension than that of the bottom pedestal 107. In such embodiments, it is advantageous to have the overlap as it will fully cover the lower level of the pedestal 107 and the microstud layer 103 during the IBE process, eliminating a possibility of undesirable etching of those layers.

Figure 8:
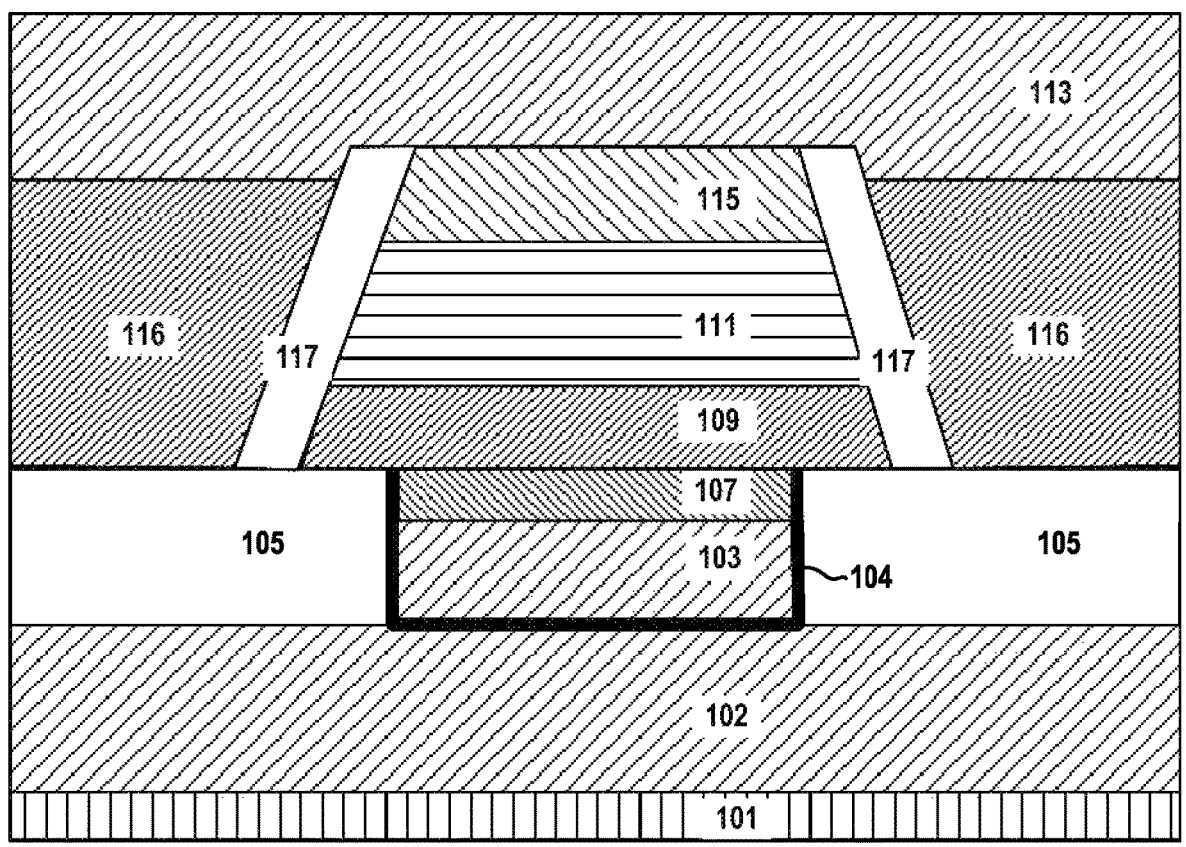
FIG. 8 is a cross-sectional diagram depicting the structure according to a first embodiment of the invention after an encapsulation layer, an inter-layer dielectric (ILD) and top interconnect deposition processes are performed.

FIG. 8 is a cross-sectional diagram depicting the structure according to a first embodiment of the invention after an encapsulation layer, an inter-layer dielectric (ILD) and top interconnect deposition processes are performed. In embodiments of the invention, the encapsulation layer 117 is made of an insulator material such as SiN or SiC. In other embodiments, other insulators are used. A chemical vapor deposition (CVD), a plasma enhanced chemical vapor deposition (PECVD), a physical vapor deposition (PVD) or an atomic layer deposition (ALD) are used deposit the encapsulation layer in different embodiments of the invention. Typically, the encapsulation layer 117 has a thickness from 1 nm to 800 nm with a thickness from 5 nm to 500 nm being more preferred in respective embodiments.

The inter-layer dielectric (ILD) 116 is a dielectric such as SiO2. A representative range of thicknesses for the ILD layer is from 50 nm to 900 nm with a thickness from 100 nm to 700 nm being more preferred in respective embodiments. In preferred embodiments, the top interconnect 113 is formed from similar materials as the bottom interconnect 102 e.g., a conductive material such as W, Cu, Al, or alloys thereof. Similar deposition processes as discussed above for the bottom interconnect are performed to produce the layer. The top interconnect layer 113 has a thickness from 10 nm to 800 nm with a thickness from 30 nm to 500 nm being more preferred in respective embodiments.

In the final structure of this embodiment, the top pedestal 109, MTJ layer 111 and hard mask layer 115 are conical sections or truncated cones having parallel top and bottom surfaces. These layers are encapsulated by the encapsulation layer 113. The bottom pedestal 107 and microstud 103 are cylinders and are fully inside the recess of the insulator 105. Depending on the processing, the bottom surface of the bottom pedestal 107 could be flat or dished. The top surface of the bottom pedestal 107 is planar due to the planarization step of the bottom pedestal material. The top and bottom surfaces of the top pedestal also are planar as the planarization of the bottom pedestal will be transmitted to overlaying layers. Also as mentioned above, an optional planarization of the top pedestal 109 occurs in some embodiments of the invention.

In other embodiments, the MRAM cell may be pseudo-conical, e.g., an elliptical cone or smoothed pyramid. That is, for the current invention, a "smoothed" surface without sharp edges is preferred from a performance perspective. Thus, the various layers exposed to the ion bombardment step will be pseudo-conical sections in terms of their shape in the final structure. Therefore, as discussed and claimed in the description a "conical" shape or a "conical" subsection is intended to include shapes that are not perfectly conical but are smoothed by the ion bombardment.

Figure 9:
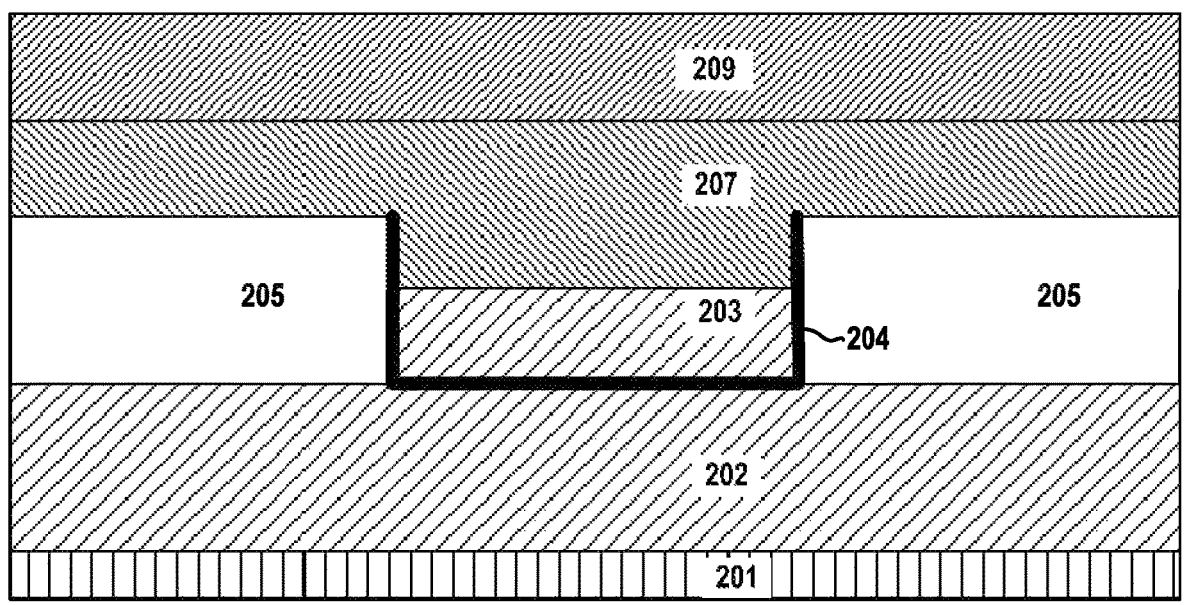
FIG. 9 is a cross-sectional diagram depicting the structure according to a second embodiment of the invention after a top layer of the bilayer pedestal is deposited.

FIG. 9 is a cross-sectional diagram depicting the structure according to a second embodiment of the invention after a top pedestal of the bilayer pedestal is deposited. This drawing is equivalent FIG. 5 of the first embodiment. Here the bottom pedestal material 207 has not been planarized flush with the field areas of the dielectric 205. Instead, the entire deposited thickness of the bottom pedestal layer 207 is retained. The top pedestal material 209 is deposited on top of the bottom pedestal 207. In this embodiment, the respective thicknesses of the deposited bottom pedestal and top pedestal layers 207, 209 range from 2 nm to 400 nm with a thicknesses ranging from 2 nm to 300 nm being more preferred.

Figure 10:
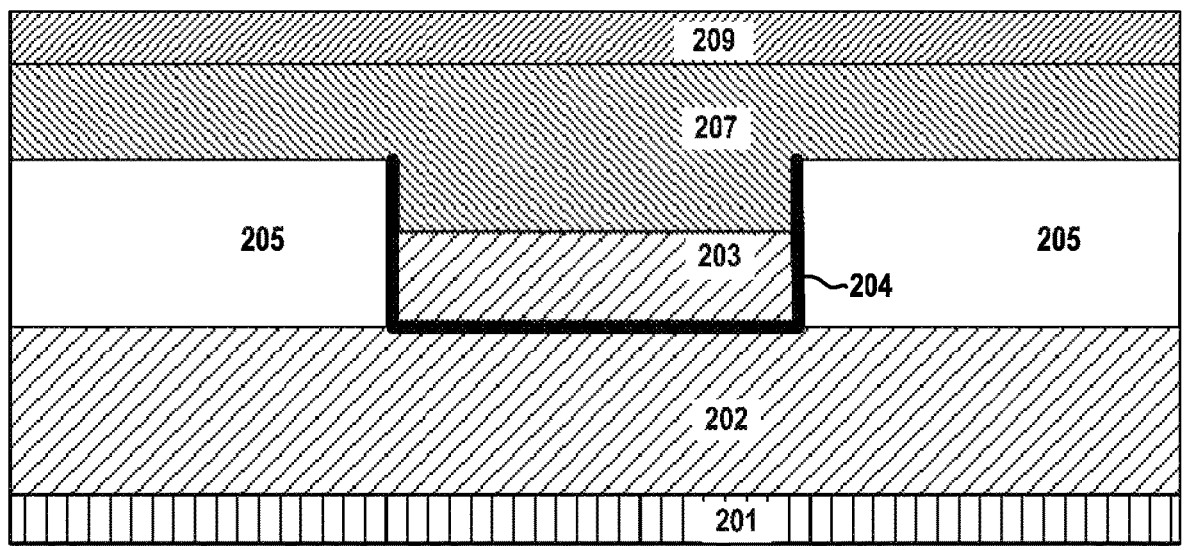
FIG. 10 is a cross-sectional diagram depicting the structure according to a second embodiment of the invention after a chemical mechanical planarization process is performed on the top layer of the bilayer pedestal.

FIG. 10 is a cross-sectional diagram depicting the structure according to a second embodiment of the invention after a chemical mechanical planarization process is performed on the top layer of the bilayer pedestal. As discussed above, having a smooth top surface of the top pedestal 209 is important for the subsequent MTJ layers and the planarization process provides that type of surface. After planarization, the thickness of the top pedestal material 209 ranges from 1 nm to 300 nm with a thickness from 2 nm to 200 nm being more preferred.

Figure 11:
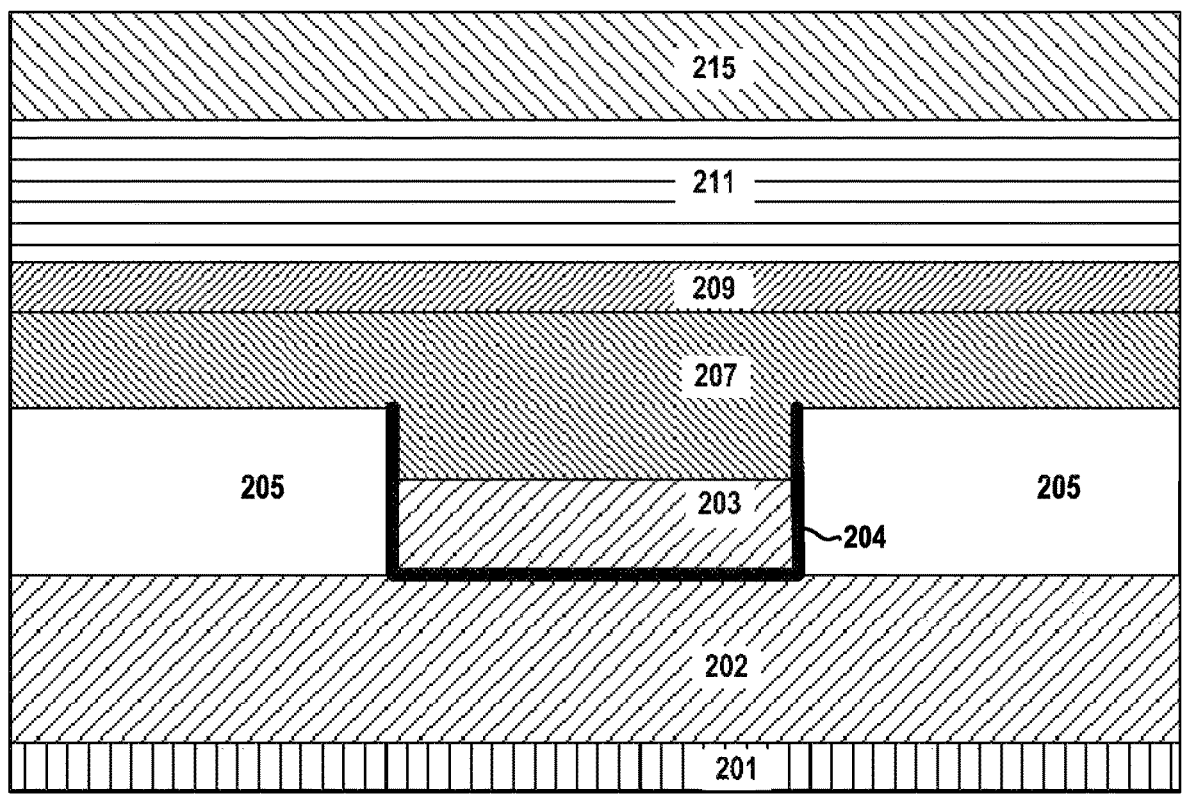
FIG. 11 is a cross-sectional diagram depicting the structure according to a second embodiment of the invention after a magnetic tunnel junction (MTJ) material layer and hard mask layer are deposited.

FIG. 11 is a cross-sectional diagram depicting the structure according to a second embodiment of the invention after a magnetic tunnel junction (MTJ) material layer 211 and a hard mask layer 215 are deposited. The thickness, materials and processes are similar to those described above in reference to the first embodiment.

Figure 12:
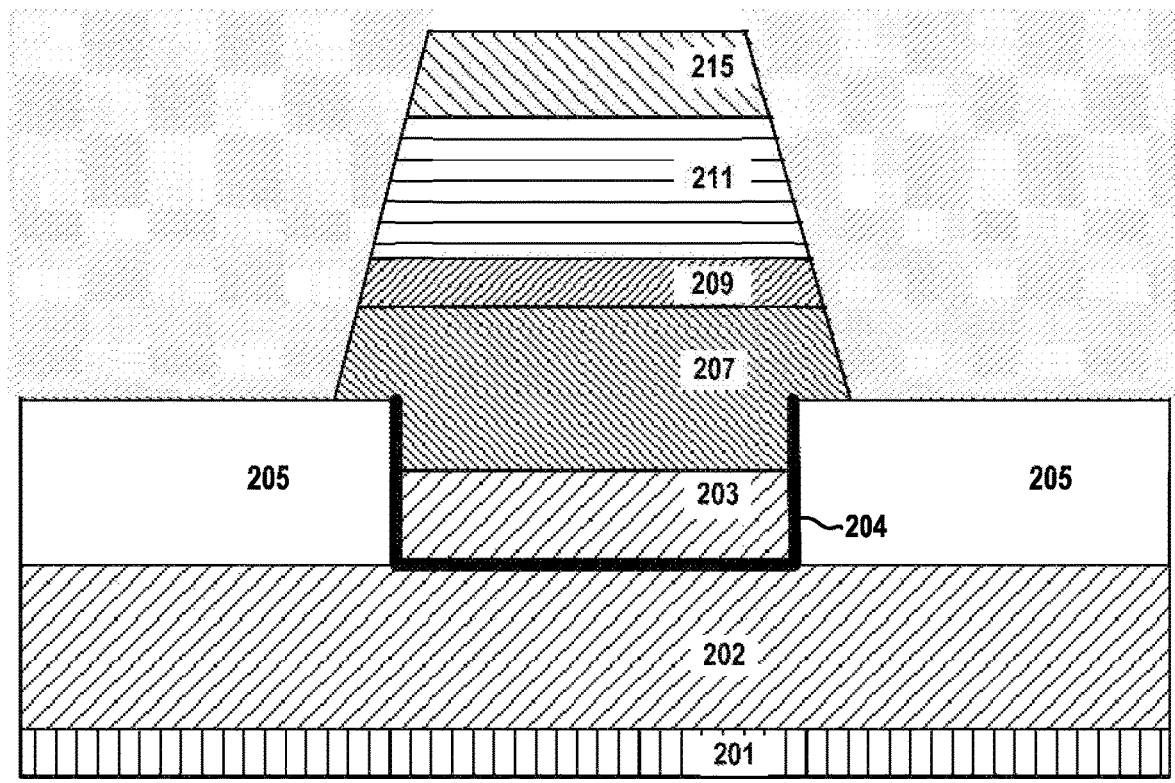
FIG. 12 is a cross-sectional diagram depicting the structure according to a second embodiment of the invention after an Ion-beam etch (IBE) process is performed.

FIG. 12 is a cross-sectional diagram depicting the structure according to a second embodiment of the invention after an Ion-beam etch (IBE) process is performed. While the MRAM cell has the same angular profile, here as compared to the first embodiment, the top pedestal 209 of the pedestal has a smaller horizontal dimension than the bottom pedestal 207. The bottom pedestal 207 does not have a top surface which is coplanar with the insulator 205. Instead, the bottom pedestal 207 is partially embedded in the recess above the microstud and extends higher than the insulator 205. Further, the bottom pedestal 207 extends over the edge of the recess horizontally. In the embodiment, the bottom pedestal layer 207 has a potential to redeposit on the MTJ layer 211. However, by controlling the thicknesses, e.g., the exposed thickness of the bottom layer 207 and the thickness of the top pedestal layer 209, the amount of redeposition of the bottom pedestal layer material on the MTJ layer 211 is minimized.

An encapsulation layer, an inter-layer dielectric (ILD) and top interconnect deposition processes are performed as described above in connection with the first embodiment, over the structure shown in FIG. 12. In the final structure of this embodiment, the top pedestal 209, MTJ layer 211 and hard mask layer 215 are conical sections or truncated cones having parallel top and bottom surfaces. The bottom pedestal 207 has a top portion which is a conical section and a bottom portion which is a cylinder. The microstud 203 is a cylinder. Although not depicted, the top pedestal 209, MTJ layer 211, hard mask layer 215 and top portion of the bottom pedestal 207 are encapsulated by the encapsulation layer. The bottom portion of the bottom pedestal 207 and the microstud 203 are inside the recess of the insulator layer. Depending on the processing, the bottom surface of the bottom pedestal 207 could be flat or dished. The top surface of the top pedestal 209 is planar due to its planarization in this embodiment of the invention.

As is known to the art, the structure is followed by additional processing to fabricate contacts for structures which attach the chip to a packaging substrate so that the chip can be incorporated into a computing device. After completing the integrated circuits in the wafer, the wafer is diced and the individual chips are placed on their respective substrates.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only a limited number of features are illustrated in the drawings, those ordinarily skilled in the art would understand that many different types of features could be simultaneously formed with the embodiments herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating a structure for an integrated circuit device comprising:
   providing a conductive microstud on a substrate, the microstud being formed in a recess of an insulator layer formed on the substrate;
   forming a bottom pedestal on a top surface of the microstud, wherein a material used for the bottom pedestal has a lower electrochemical voltage than a material used for the microstud;
   forming a top pedestal on a top surface of the bottom pedestal;
   planarizing the top surface of at least one of the bottom pedestal and top pedestal;
   forming a conductive layer on a top surface of the top pedestal; and
   forming a conical structure, wherein the conical structure is comprised of at least the conductive layer and a top portion of the top pedestal, wherein a lower portion of the bottom pedestal is formed in the top portion of the recess and a top portion of the bottom pedestal is part of the conical structure.

2. The method as recited in claim 1, wherein the bottom pedestal is formed inside a top portion of the recess that the microstud is formed in and the top surface of the bottom pedestal is coplanar with a top surface of the insulator layer due to a planarization process performed on the bottom pedestal.

3. The method as recited in claim 2, further comprising planarizing the top surface of the top pedestal, wherein a material used for the top pedestal has a high oxidation rate.

4. The method as recited in claim 1, wherein the conductive layer is a magnetic tunnel junction (MTJ) layer, and the method further comprises:
   forming a hard mask layer on a top surface of the MTJ layer prior to using the ion bombardment process;
   using an ion bombardment process to form the conical structure; and
   encapsulating the hard mask layer, the MTJ layer and the top portion of the top pedestal;
   wherein the conical structure is used in a Magnetoresistive random-access memory (MRAM) device.

5. The method as recited in claim 1, wherein the conductive layer is a metal layer and the conical structure is used to interconnect two levels of metal lines.

6. The method as recited in claim 1, wherein the top surface of the top pedestal is planarized.

7. The method as recited in claim 6, wherein the top pedestal is formed by a physical vapor deposition (PVD) or an ionized (iPVD) deposition process.

8. A method for fabricating a structure for an integrated circuit device comprising:
   providing a conductive microstud on a substrate, the microstud being formed in a recess of an insulator layer formed on the substrate;
   forming a bottom pedestal on a top surface of the microstud, wherein a material used for the bottom pedestal has a lower electrochemical voltage than a material used for the microstud;
   forming a top pedestal on a top surface of the bottom pedestal;
   planarizing the top surface of at least one of the bottom pedestal and top pedestal;
   forming a conductive layer on a top surface of the top pedestal; and
   forming a conical structure, wherein the conical structure is comprised of at least the conductive layer and a top portion of the top pedestal,
   wherein the top pedestal is comprised of TiN, the bottom pedestal is comprised of TaN and the microstud is comprised of Cu.

9. An interconnect structure in an integrated circuit device comprising:
   an insulator layer on a substrate, the insulator layer having a recess therein;
   a microstud comprised of a conductive material;
   a bottom pedestal on a top surface of the microstud, wherein a material used for the bottom pedestal has a lower electrochemical voltage than a material used for the microstud;
   a top pedestal on a top surface of the bottom pedestal; and
   a conical structure, wherein the conical structure is comprised of at least the conductive layer and a top portion of the top pedestal;
   wherein the top surface of at least one of the bottom pedestal and top pedestal is planarized, wherein a lower portion of the bottom pedestal is formed in the top portion of the recess and a top portion of the bottom pedestal is part of the conical structure.

10. The device as recited in claim 9, wherein the bottom pedestal is formed inside a top portion of the recess that the microstud is formed in and the top surface of the bottom pedestal is coplanar with a top surface of the insulator layer.

11. The device as recited in claim 9, further comprising a second metal layer in the compound recess forming the via connector and the second level metal line, wherein the via connector has a concave profile with respect to the second metal layer over the opposite gouging feature.

12. The device as recited in claim 10, further comprising a magnetic tunnel junction (MTJ) layer disposed on a top surface of the top pedestal, a hard mask layer on a top surface of the MTJ layer;

an encapsulation layer encapsulating the hard mask layer, the MTJ layer and the top portion of the top pedestal;

wherein the hard mask layer, the MTJ layer and the top portion of the top pedestal form a conical structure and the device is a Magnetoresistive random-access memory (MRAM) device.

13. The device as recited in claim 9, further comprising:

a conductive layer disposed on a top surface of the top pedestal, a hard mask layer on a top surface of the conductive layer;

an encapsulation layer encapsulating the conductive layer, the MTJ layer and the top portion of the top pedestal;

wherein the hard mask layer, the conductive layer and the top portion of the top pedestal form a conical structure, wherein the conductive layer is a metal layer and the conical structure is used to interconnect two levels of metal lines.

14. The device as recited in claim 9, wherein the bottom pedestal is comprised of a material selected from the group of Ta, W, Ti, Al, Ru, Rh, Ir, Co, Pt, Nb, Cr, Mo and Ni and their nitrides.

15. The device as recited in claim 14, wherein the top pedestal is comprised of a material selected from the group of Ta, W, Ti, Al, Ru, Rh, Ir, Co, Pt, Nb, Cr, Mo and Ni and their nitrides.

16. An interconnect structure in an integrated circuit device comprising:

an insulator layer on a substrate, the insulator layer having a recess therein;

a microstud comprised of a conductive material;

a bottom pedestal on a top surface of the microstud, wherein a material used for the bottom pedestal has a lower electrochemical voltage than a material used for the microstud;

a top pedestal on a top surface of the bottom pedestal; and wherein the top surface of at least one of the bottom pedestal and top pedestal is planarized, wherein the top pedestal is comprised of TiN, the bottom pedestal is comprised of TaN and the microstud is comprised of Cu.

* * * * *